(12) United States Patent  
Ishii et al.

(10) Patent No.: US 10,482,949 B2  
(45) Date of Patent: Nov. 19, 2019

(54) SEMICONDUCTOR DEVICE

(71) Applicant: Renesas Electronics Corporation, Tokyo (JP)

(72) Inventors: Yuichiro Ishii, Tokyo (JP); Atsushi Miyanishi, Tokyo (JP); Kazumasa Yanagisawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/272,123

(22) Filed: Feb. 11, 2019

(65) Prior Publication Data

US 2019/0172524 A1    Jun. 6, 2019

Related U.S. Application Data

(63) Continuation of application No. 15/921,226, filed on Mar. 14, 2018, now Pat. No. 10,224,096, which is a (Continued)

(30) Foreign Application Priority Data

Oct. 31, 2014    (JP) .................................. 2014-223178

(51) Int. Cl.  
*G11C 5/14*          (2006.01)  
*G11C 11/417*    (2006.01)  
(Continued)

(52) U.S. Cl.  
CPC ........ *G11C 11/417* (2013.01); *H01L 23/5286* (2013.01); *H01L 27/1104* (2013.01);  
(Continued)

(58) Field of Classification Search  
CPC .............. G11C 11/417; H03K 19/0016; H03K 17/6871; H01L 23/5286; H01L 27/1104; H01L 27/1116; H01L 29/1095  
(Continued)

(56) References Cited

U.S. PATENT DOCUMENTS 5,293,334 A    3/1994 Shimizu  
5,499,213 A    3/1996 Niimi  
(Continued)

FOREIGN PATENT DOCUMENTS

JP    2006-221796 A    8/2006  
JP    2007-250586 A    9/2007  
(Continued)

OTHER PUBLICATIONS

United States Notice of Allowance dated Sep. 26, 2016 in U.S. Appl. No. 14/866,544.

(Continued)

*Primary Examiner* — Viet Q Nguyen  
(74) *Attorney, Agent, or Firm* — McGinn IP Law Group, PLLC (57) ABSTRACT

A semiconductor device includes a first mode and a second mode different from the first mode, includes a memory circuit including a first switch, a memory array, and a peripheral circuit. A first power source line is electrically coupled with an I/O circuit of the peripheral circuit and is supplied with a first voltage in the first mode. A second power source line is electrically coupled with a memory cell of the memory array, and supplied with a second voltage lower than the first voltage in the second mode.

8 Claims, 8 Drawing Sheets

Related U.S. Application Data continuation of application No. 15/799,073, filed on Oct. 31, 2017, now Pat. No. 9,959,925, which is a continuation of application No. 15/389,192, filed on Dec. 22, 2016, now Pat. No. 9,837,140, which is a continuation of application No. 14/866,544, filed on Sep. 25, 2015, now Pat. No. 9,559,693.

(51) Int. Cl.
| | | |
|---|---|---|
| H03K 19/00 | (2006.01) | |
| H03K 17/687 | (2006.01) | |
| H01L 23/528 | (2006.01) | |
| H01L 27/11 | (2006.01) | |
| H01L 29/10 | (2006.01) | |

(52) U.S. Cl.
CPC ...... *H01L 27/1116* (2013.01); *H01L 29/1095* (2013.01); *H03K 17/6871* (2013.01); *H03K 19/0016* (2013.01)

(58) Field of Classification Search
USPC .......................................................... 365/226
See application file for complete search history.

(56) References Cited

U.S. PATENT DOCUMENTS

| | | | |
|---|---|---|---|
| 5,561,384 A | 10/1996 | Reents | |
| 5,606,265 A * | 2/1997 | Sakata | G11C 5/147 326/34 |
| 5,659,517 A | 8/1997 | Arimoto | |
| 5,811,991 A * | 9/1998 | Takashima | H03K 19/0016 326/97 |
| 5,898,232 A | 4/1999 | Reents | |
| 6,215,716 B1 * | 4/2001 | Itoh | G11C 11/412 365/154 |
| 6,337,593 B1 | 1/2002 | Mizuno | |
| 6,388,857 B1 | 5/2002 | Sato | |
| 6,603,345 B2 | 8/2003 | Takahashi | |
| 6,750,527 B1 | 6/2004 | Momohara | |
| 7,362,646 B2 | 4/2008 | Otsuka et al. | |
| 7,436,206 B2 | 10/2008 | Kurotsu | |
| 7,675,347 B2 | 3/2010 | Teramoto | |
| 7,786,793 B2 * | 8/2010 | Ogata | G06F 1/32 327/530 |
| 7,839,205 B2 | 11/2010 | Hirobe | |
| 8,299,847 B2 | 10/2012 | Matano | |
| 8,406,075 B2 | 3/2013 | Lee | |
| 8,432,190 B2 | 4/2013 | Ishii et al. | |
| 8,456,223 B2 * | 6/2013 | Myers | H03K 19/0016 327/534 |
| 8,519,775 B2 | 8/2013 | Idgunji | |
| 8,638,593 B2 | 1/2014 | Takagi et al. | |
| 8,687,452 B2 | 4/2014 | Kishibe | |
| 8,890,602 B2 | 11/2014 | Sinha | |
| 9,001,572 B2 * | 4/2015 | Choi | G11C 5/14 365/156 |
| 9,083,186 B2 * | 7/2015 | Aoyagi | H02J 1/00 |
| 9,231,580 B2 | 1/2016 | Ku | |
| 9,387,140 B2 | 7/2016 | Tekulve | |
| 9,432,014 B2 | 8/2016 | Kuenemund | |
| 9,496,863 B2 | 11/2016 | Jeon | |
| 9,559,693 B2 * | 1/2017 | Ishii | H03K 19/0016 |
| 9,720,434 B2 | 8/2017 | Myers | |
| 9,837,140 B2 * | 12/2017 | Ishii | H03K 19/0016 |
| 9,853,640 B2 * | 12/2017 | Bell | G09C 1/00 |
| 9,959,925 B2 * | 5/2018 | Ishii | H03K 19/0016 |
| 10,102,899 B2 * | 10/2018 | Sawada | G11C 11/41 |
| 10,224,096 B2 * | 3/2019 | Ishii | H03K 19/0016 |
| 10,447,257 * | 10/2019 | Tanabe | H03K 17/04106 |
| 2001/0038552 A1 * | 11/2001 | Ishimaru | G11C 11/412 365/181 |
| 2001/0043085 A1 * | 11/2001 | Shimazaki | H03K 19/0013 326/112 |
| 2002/0008999 A1 | 1/2002 | Hidaka | |
| 2002/0024059 A1 | 2/2002 | Hidaka | |
| 2002/0186581 A1 | 12/2002 | Yamaoka | |
| 2003/0006833 A1 | 1/2003 | Koga | |
| 2003/0012049 A1 * | 1/2003 | Itoh | G11C 11/412 365/154 |
| 2003/0067318 A1 | 4/2003 | Takahashi | |
| 2004/0080340 A1 * | 4/2004 | Hidaka | G11C 5/147 326/83 |
| 2005/0213414 A1 * | 9/2005 | Horiguchi | G06F 1/3203 365/226 |
| 2006/0291124 A1 | 12/2006 | Kanda | |
| 2007/0211545 A1 | 9/2007 | Otsuka et al. | |
| 2008/0093632 A1 * | 4/2008 | Sakurabayashi | H01L 27/11807 257/207 |
| 2009/0039708 A1 | 2/2009 | Zanders | |
| 2010/0264735 A1 | 10/2010 | Yamaoka | |
| 2013/0300462 A1 | 11/2013 | Koyama | |
| 2014/0189381 A1 | 7/2014 | Notani et al. | |
| 2015/0326225 A1 * | 11/2015 | Kato | H03K 3/012 326/83 |
| 2016/0109932 A1 | 4/2016 | Jeon | |
| 2016/0111134 A1 | 4/2016 | Ishimaru | |

FOREIGN PATENT DOCUMENTS

| | | |
|---|---|---|
| JP | 2011-222919 A | 11/2011 |
| JP | 2012-175012 A | 9/2012 |
| JP | 2014-130406 A | 7/2014 |

OTHER PUBLICATIONS

United States Notice of Allowance dated Sep. 16, 2017 in U.S. Appl. No. 15/389,192.
U.S. Non-Final Office Action dated May 16, 2017 in U.S. Appl. No. 15/389,192.
United States Notice of Allowance dated Dec. 20, 2017 in U.S. Appl. No. 15/799,073.
Japanese Office Action dated Mar. 6, 2018, in corresponding Japanese Patent Application No. 2014-223178 with an English translation thereof.
Japanese Office Action dated Aug. 7, 2018, in Japanese Application No. 2014-223178 with English translation thereof.
U.S. Non-Final Office Action dated May 17, 2018, in U.S. Appl. No. 15/921,226.
United States Notice of Allowance dated Oct. 17, 2018, in U.S. Appl. No. 15/921,226.
Taiwanese Office Action dated Apr. 26, 2019, in Taiwanese Patent Application No. 104132611 with an English translation.
Japanese Office Action dated Jul. 16, 2019, in corresponding Japanese Patent Application No. 2018-210002, with an English translation thereof.
Chinese Office Action dated Sep. 2, 2019, in Chinese Patent Application No. 201510727316.5 with an English translation.

* cited by examiner

SEMICONDUCTOR DEVICE

CROSS-REFERENCE TO RELATED APPLICATIONS

The present application is a Continuation Application of U.S. patent application Ser. No. 15/921,226, filed on Mar. 14, 2018, which is a Continuation Application of U.S. patent application Ser. No. 15/799,073, filed on Oct. 31, 2017, now U.S. Pat. No. 9,959,925 B2, which is a Continuation Application of U.S. patent application Ser. No. 15/389,192, filed on Dec. 22, 2016, now U.S. Pat. No. 9,837,140 B2, which is a Continuation Application of U.S. patent application Ser. No. 14/866,544, filed on Sep. 25, 2015, now U.S. Pat. No. 9,559,693 B2, issued on Jan. 31, 2017, which is based on and claims priority to Japanese Patent Application No. 2014-223178 filed on Oct. 31, 2014 and which is incorporated herein by reference in its entirety.

BACKGROUND

The present disclosure relates to a semiconductor device, and in particular relates to power source control of the semiconductor device which includes an active mode and a standby mode as operation modes.

The semiconductor device such as a microcomputer and so forth includes a power source circuit adapted to generate a power source voltage (hereinafter, also referred to as an internal power source voltage) to be supplied to an internal circuit. In the semiconductor devices so configured, one semiconductor device which is configured to switch a power source circuit to be operated depending on whether the semiconductor device is in operation (in the active mode) or is put on standby (in the standby mode) is widely used in order to implement high-speed operation and low power consumption.

It is necessary for the power source circuit to generate a stable power source voltage in the both operation modes of the active mode and the standby mode of the semiconductor device. For this purpose, in the active mode that the power consumption is high and a voltage drop is liable to occur, a power source circuit which is high in power supplying capability is used, while in the standby mode that the power consumption is low, a power source circuit which is reduced in power consumption is used for implementing low power consumption.

In a chip with multiple power sources, it is necessary to sequentially rise a plurality of power source voltages in accordance with a power source start-up sequence which has been defined in advance so as not to cause such a defect that respective circuits are biased in a forward direction in power-on. Control of this power source start-up sequence imposes restrictions on users.

In this respect, a configuration that a switch circuit is provided so as not to cause the defect that the circuits are biased in the forward direction regardless of the power on sequence is disclosed (see Japanese Unexamined Patent Application Publication No. 2014-130406).

Specifically, there is proposed the switch circuit configured to short-circuit a supply path of a power source voltage to a memory cell of a memory array and a supply path of a power source voltage for a peripheral circuit in the active mode and to supply only the power source voltage to the memory cell of the memory array and to shut down the supply path of the power source voltage for the peripheral circuit in the standby mode.

SUMMARY

However, in general, the above-mentioned switch circuit is provided on the power source circuit side. Therefore, there is the possibility that a potential difference may be generated by wiring resistance on the internal circuit side of a semiconductor device to be coupled with two kinds of power source lines. Thereby, there is the possibility that a malfunction, a leakage current and so forth may be generated.

The present disclosure has been made in order to solve the above-mentioned drawbacks and aims to provide a semiconductor device which causes no defects regardless of the power-on sequence.

Other drawbacks to be solved and novel features of the present disclosure will become apparent from description of the specification and the appended drawings of the present disclosure.

According to one embodiment of the present disclosure, there is provided a semiconductor device including an active mode and a standby mode as operation modes. The semiconductor device includes a first power source line which accepts the supply of power in the active mode, a second power source line which accepts the supply of power in the active mode and the standby mode, a memory circuit to be coupled with the first and second power source lines and a first switch which electrically couples the first power source line with the second power source line in the active mode and electrically decouples the first power source line from the second power source line in the standby mode. The memory circuit includes a memory array to be coupled with the second power source line, a peripheral circuit to be coupled with the first power source line and a second switch which electrically couples the first power source line with the second power source line in the active mode and electrically decouples the first power source line from the second power source line in the standby mode. The first and second switches each includes a first PMOS transistor a source and an N-type well of which are to be coupled to the first power source line and a second PMOS transistor a source and an N-type well of which are to be coupled to the second power source line and a drain of which is to be coupled to a drain of the first PMOS transistor.

According to one embodiment of the present disclosure, it is possible to implement the semiconductor device which causes no defect regardless of the power-on sequence.

DETAILED DESCRIPTION

One embodiment of the present disclosure will be described in detail with reference to the drawings. Incidentally, the same numerals are assigned to the same or corresponding parts and repetitive description thereof is omitted.

Figure 1:
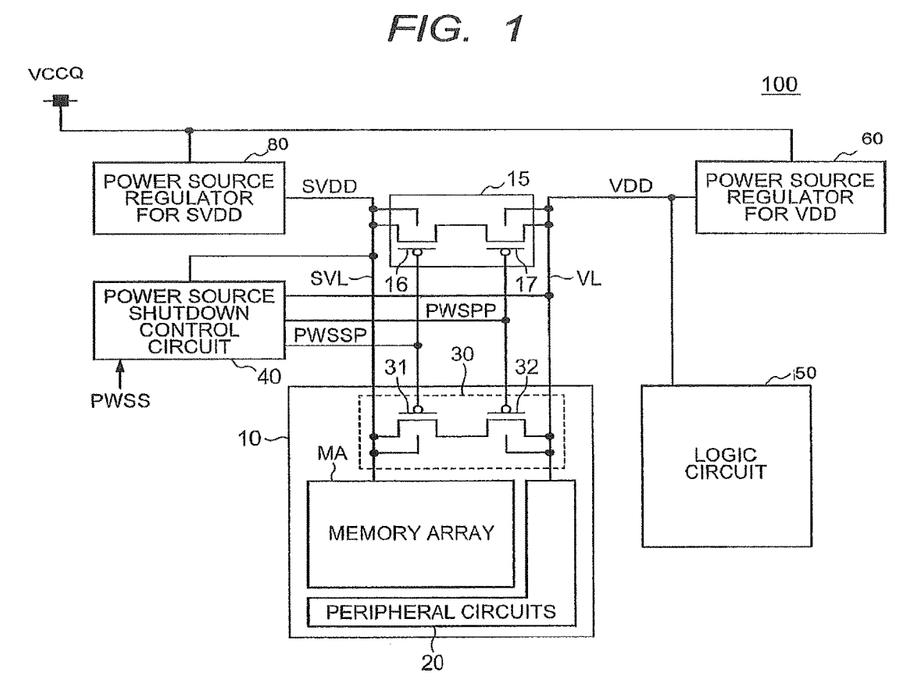
FIG. 1 is a diagram illustrating one example of a general configuration of a semiconductor device 100 according to one embodiment.

FIG. 1 is a diagram illustrating one example of a general configuration of the semiconductor device 100 according to the present embodiment.

Referring to FIG. 1, the semiconductor device 100 includes a logic circuit 50, a memory circuit 10 including memory cells, a VDD power source regulator 60 which receives an external power source voltage VCCQ supplied from the outside, steps down the external power source voltage VCCQ and generates a first internal power source voltage (a voltage VDD), an SVDD power source regulator 80 which steps down the external power source voltage VCCQ and generates a second internal power source voltage (a voltage SVDD), a power source shutdown control circuit 40, the switch 15 and so forth.

The SVDD power source regulator 80 supplies the voltage SVDD to a power source line SVL.

The VDD power source regulator 60 supplies the voltage VDD to a power source line VL.

The logic circuit 50 is coupled with the power source line VL and operates by accepting the supply of the voltage from that power source line VL.

The memory circuit 10 is coupled with the power source line VL and the power source line SVL and operates by accepting the supply of the voltages from the power source lines VL and SVL.

The switch 15 includes P channel MOS transistors 16 and 17.

The P channel MOS transistors 16 and 17 are coupled in series with each other between the power source line SVL and the power source line VL.

The memory circuit 10 includes the memory array MA including the memory cells, the peripheral circuit 20, the switch 30 and so forth.

The memory array MA is coupled with the power source line SVL and operates by accepting the supply of the voltage from the power source line SVL.

The peripheral circuit 20 is coupled with the power source line VL and operates by accepting the supply of the voltage from the power source line VL. The switch 30 includes P channel MOS transistors 31 and 32.

The P channel MOS transistors 31 and 32 are coupled in series with each other between the power source line SVL and the power source line VL.

The power source shutdown control circuit 40 generates and outputs control signals for controlling the switches 15 and 30. Specifically, the power source shutdown control circuit 40 generates control signals PWSSP and PWSPP on the basis of a control command PWSS and voltage levels of the power source line SVL and the power source line VL.

The control signal PWSSP is input into gates of the P channel MOS transistors 16 and 31.

The control signal PWSPP is input into gates of the P channel MOS transistors 17 and 32.

Specifically, the power source shutdown control circuit 40 generates the control signals such that the switches 15 and 30 conduct and the power source line VL and the power source line SVL are short-circuited in the active mode, and generates the control signals such that the switches 15 and 30 become nonconductive and a short-circuit of the power source line VL and the power source line SVL is decoupled in the standby mode that the power from the VDD power source regulator 60 is shut down.

Thereby, the voltage supply to the peripheral circuit 20 of the memory circuit 10 is stopped in the standby mode and therefore the voltage SVDD is supplied only to the memory array MA via the power source line SVL. Therefore, it is possible to promote a reduction in standby current.

Figure 2:
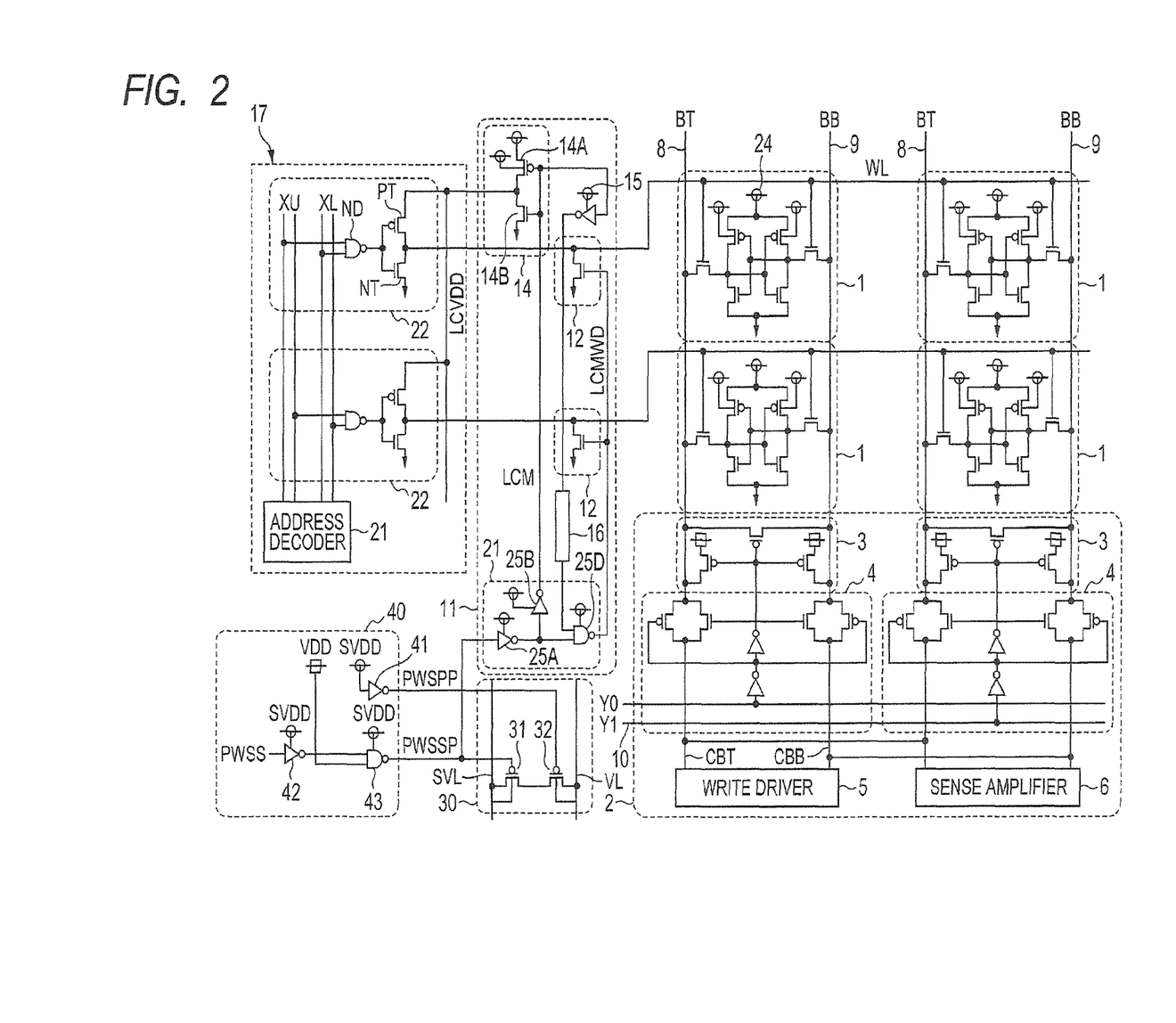
FIG. 2 is a diagram illustrating one example of configurations of a memory array MA, a peripheral circuit 20 and a power source shutdown control circuit 40 according to the embodiment.

FIG. 2 is an explanatory diagram illustrating one example of configurations of the memory array MA, the peripheral circuit 20 and the power source shutdown control circuit 40 according to the embodiment.

As illustrated in FIG. 2, the memory array MA includes a plurality of memory cells 1 which have been arranged in a matrix. Each memory cell 1 is an SRAM (Static Random Access Memory) which has been provided so as to be rewritable. In the example in FIG. 2, a six-transistor SRAM cell is illustrated. Since details of the SRAM cell are well known, detailed description thereof is omitted. An access transistor is electrically coupled with a corresponding word line WL. The access transistor becomes conductive in accordance with the word line WL which has been activated when executing data reading from or data writing into the memory cell 1 concerned.

Each memory cell 1 is coupled with the power source line SVL so as to be electrically coupled with a source of a voltage SVDD to be supplied from the power source line SVL and a source of a ground voltage (a fixed voltage) VSS. In the example in FIG. 2, memory cells 1 which are arranged in a matrix of two rows by two columns are illustrated.

The plurality of word lines ML are provided respectively corresponding to the memory cell rows of the memory array MA.

In addition, a plurality of sets of bit line pairs are provided respectively corresponding to the columns of memory cells 1 of the memory array MA. In the example in FIG. 2, two columns of memory cells 1 are illustrated. Two sets of bit line pairs BT, BB are provided corresponding to the two columns of memory cells 1.

The peripheral circuit 20 includes an I/O circuit 2, a driver and decoder 17 and so forth.

The I/O circuit 2 includes a pre-charge circuit 3, a selection circuit 4, a write driver 5, a sense amplifier 6 and so forth which are provided for every column of the memory cells 1. The I/O circuit 2 is coupled with the power source line VL and a voltage VDD is supplied to the I/O circuit 2.

The pre-charge circuit 3 equalizes the corresponding bit line pair and sets the voltage thereof to the voltage VDD of the power source line VL in data reading.

The selection circuit 4 selects the bit line pair concerned in accordance with decode signals Y1 and Y0.

In the example in FIG. 2, the decode signals Y1 and Y0 are generated on the basis of one-bit column address data by a not illustrated column decoder.

The selection circuit 4 couples the bit line pair BT, BB concerned with a data line pair CBT, CBB in accordance with the decode signals Y1 and Y0.

When the decode signals Y1 and Y0 are "0s" ("L" levels), the pre-charge circuit 3 is activated, couples together and equalizes the bit line pair BT and BB, and electrically couples the bit lines pair BT and BB with a source of the voltage VDD.

The write driver 5 writes data into the memory array MA in accordance with write data in data writing. Specifically, the write driver 5 is activated in accordance with an activation signal and drives the bit line pair BT, BB concerned on the basis of the write data.

The sense amplifier 6 outputs read data from the memory array MA in data reading. Specifically, in data reading, the sense amplifier 6 amplifies a difference between potentials transmitted to the bit line pair and outputs the read data in accordance with data that the memory cell 1 concerned holds.

The driver and decoder 17 is coupled with the power source line VL and operates by accepting the supply of the voltage VDD.

The driver and decoder 17 includes an address recorder 21 which pre-decodes a row address signal, a plurality of driver units 22 provided corresponding to the plurality of word lines WL which have been provided respectively corresponding to the rows of memory cells 1 and so forth.

The address decoder 21 pre-decodes a high-order bit on the basis of the row address signal and, as a result, outputs a pre-decode signal XU. In addition, the address decoder 21 pre-decodes a low-order bit of the row address signal and, as a result, outputs a pre-decode signal XL.

The driver unit 22 includes an NAND circuit ND which outputs a selection signal on the basis of the pre-decode signal XU and the pre-decode signal XL, a P channel MOS transistor PT and an N channel MOS transistor NT which drive the word line WL on the basis of the selection signal from the NAND circuit ND and so forth.

The P channel MOS transistor PT and the N channel MOS transistor NT are coupled between a word power source line LCVDD and the source of the ground voltage VSS and a coupling node between the transistors PT and NT is electrically coupled with the word line WL.

When the selection signal from the NAND circuit ND is "0" (the "L" level), the P channel MOS transistor PT conducts and the word power source line LCVDD and the word line WL are electrically coupled with each other.

When the selection signal from the NAND circuit ND is "1" (a "H" level), the N channel MOS transistor NT conducts and the source of the ground voltage VSS and the word line WL are electrically coupled with each other.

Incidentally, in general, from the viewpoint of attaining operational stability of the memory cell 1, the same potential as that of the memory cell 1 is supplied to the word line WL. Accordingly, the source of the voltage SVDD for memory cell is coupled to a source and a back gate of the P channel MOS transistor PT of the driver unit 22.

Next, a word line fixing circuit 11 will be described. The word line fixing circuit 11 is driven with the voltage SVDD.

The word line fixing circuit 11 includes a plurality of fixing transistors 12 provided respectively corresponding to the plurality of word lines WL, a control circuit 13 which generates a word line fixing signal LCMWD, a power source line drive circuit 14 which drives the word power source line LCVDD, a delay element 16, an inverter 15 and so forth.

The delay element 16 delays a signal for a fixed period of time by using a resistor or an inverter and so forth. Incidentally, the delay element 16 may be formed on the basis of a wiring resistance without forming a physical circuit.

The control circuit 13 includes inverters 25A and 25B, a NAND circuit 25D and so forth.

The inverter 25A accepts input of the control signal PWSSP.

The inverter 25B outputs a control signal LM obtained by inverting an output signal from the inverter 25A.

The power source line drive circuit 14 is driven with the control signal LCM.

The power source line drive circuit 14 includes a P channel MOS transistor 14A and an N channel MOS transistor 14B which have been provided between the sources of the voltage SVDD and the ground voltage VSS.

A coupling node between the P channel MOS transistor 14A and the N channel MOS transistor 14B is coupled with the word power source line LCVDD. Gates of the P channel MOS transistor 14A and the N channel MOS transistor 14B accept input of the control signal LCM.

When the control signal LCM is "0" (the "L" level), the P channel MOS transistor 14A conducts and the word power source line LCVDD and the source of the voltage SVDD are electrically coupled with each other.

When the control signal LCM is "1" (the "H" level), the N channel MOS transistor 14B conducts and the word power source line LCVDD and the source of the ground voltage VSS are electrically coupled with each other.

The control signal LCM is input into one input node of the NAND circuit 25D via the inverter 15 and the delay element 16.

Another input node of the NAND circuit 25D accepts input of an output signal from the inverter 25A.

The NAND circuit 25D outputs a result of NAND logic arithmetic operation of the output signal from the inverter 25A and a signal transmitted via the delay element 16 and so forth as the word line fixing signal LCMWD.

The power source shutdown control circuit 40 includes inverters 41 and 42, a NAND circuit 43 and so forth.

The inverter 41 outputs an inverted signal of a signal transmitted via the power source line SVL as the control signal PWSPP in accordance with the voltage level of the power source line SVL. Specifically, the inverter 41 sets the control signal PWSPP to the "L" level when the voltage level of the power source line SVL has reached the "H" level.

The inverter 42 outputs an inverted signal of a control command PWSS to one of input nodes of the NAND circuit 43 in accordance with the control command PWSS. The control command PWSS is a command for controlling the standby mode and the active mode, and is set to the "H" level in the standby mode and is set to the "L" level in the active mode.

The NAND circuit 43 outputs a result of NAND logic arithmetic operation of the output signal from the inverter 42 and the voltage level of the power source line VL as the control signal PWSSP.

In the example in FIG. 2, since the power source shutdown control circuit 40 outputs the control signal PWSPP (the "L" level) when the voltage level of the power source line SVL has reached the "H" level, the P channel MOS transistor 32 is in a conductive state. In addition, since, in the active mode, the control command PWSS is set to the "L" level, the output from the inverter 42 is set (maintained) at the "H" level. Accordingly, since the NAND circuit 43 outputs the control signal PWSSP (the "L" level) when the voltage level of the power source line SVL is the "H" level, the P channel MOS transistor 31 is in the conductive state. Accordingly, in the active mode, both of the P channel MOS transistors 31 and 32 are in the conductive states and the power source lines VL and SVL are in a short-circuited state.

On the other hand, since, in the standby mode, the control command PWSS is set to the "H" level, the NAND circuit 43 sets the P channel MOS transistor 31 to a non-conductive state in order to output the control signal PWSSP (the "H" level). Also when the voltage level of the power source line VL has reached the "L" level, the NAND circuit 43 sets the P channel MOS transistor 31 to the non-conductive state in order to output the control signal PWSSP (the "H" level). Accordingly, since in the standby mode, the P channel MOS transistor 31 is in the non-conductive state, the power source lines VL and the SVL are in mutually decoupled states.

Figure 3:
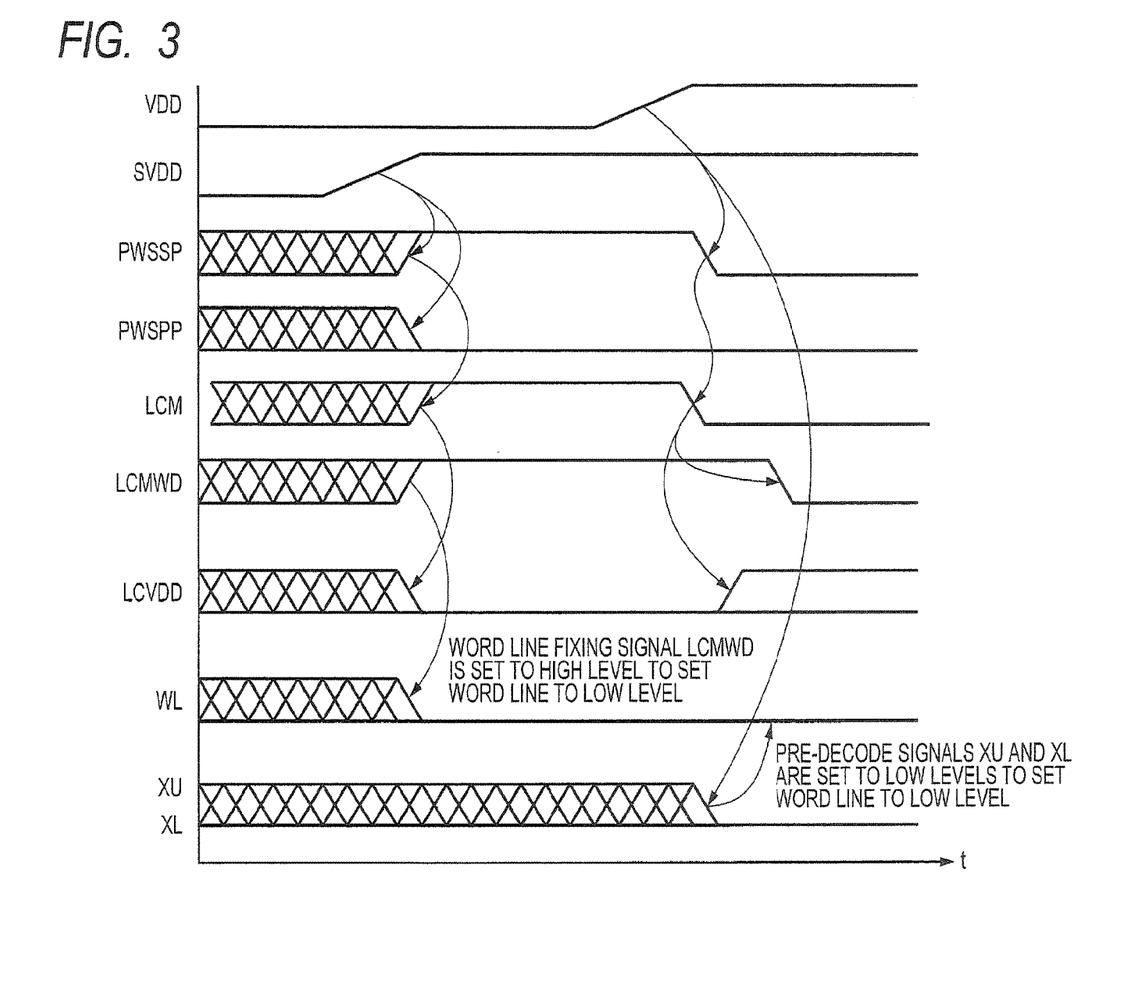
FIG. 3 is an explanatory diagram illustrating one example of potential levels in power-on according to the embodiment.

FIG. 3 is an explanatory diagram illustrating one example of potential levels in power-on according to the embodiment.

As illustrated in FIG. 3, an operation when the voltage SVDD has been powered on first will be described.

First, a case where both of the voltage VDD and the voltage SVDD are not powered on (both are at the "L" level) will be described.

Since the voltage is not also applied to an N type well N-Well of the transistor concerned, no signal is transmitted to the transistor and all of the control signal LCM, the word line fixing signal LCMWD, signals transmitted via the word power source line LCVDD and the word line WL, and the pre-decode signals XU and XL are in indefinite states.

Next, a case where the voltage SVDD has been powered on and the potential thereof has shifted to the "H" level is illustrated. Thereby, the voltage is applied to the N type well N-Well of the transistor to which the source of the voltage SVDD has been coupled and a signal of a circuit to which the source of the voltage SVDD has been coupled is propagated.

In case of the example in FIG. 3, the voltage VDD for the peripheral circuit maintains the "L" level state.

The power source shutdown control circuit 40 sets the control signal PWSPP to the "L" level in accordance with rising of the voltage SVDD. On the other hand, since the voltage VDD maintains the "L" level state, the power source shutdown control circuit 40 sets the control signal PWSSP to the "H" level.

Accordingly, in this case, the P channel MOS transistors 31 and 32 of the switch 30 do not conduct.

On the other hand, the control circuit 13 sets the control signal LCM to the "H" level in accordance with the control signal PWSSP. Thereby, the N channel MOS transistor 14B of the power source line drive circuit 14 conducts and electrically couples the word power source line LCVDD with the source of the ground voltage VSS.

In addition, the NAND circuit 25D of the control circuit 13 sets the word line fixing signal LCMWD to the "H" level in accordance with input of the signal (the "L" level) according to the potential of the voltage VDD.

The fixing transistor 12 conducts in accordance with the word line fixing signal LCMWD (the "H" level) and electrically couples the word line WL with the source of the ground voltage VSS. The word line WL is set to the "L" level.

Thereby, even when the voltage source SVDD has been powered on earlier than the voltage VDD in power-on, the word line WL is set to the "L" level and therefore the access transistor of the memory cell 1 comes into the nonconductive state.

Accordingly, the potential of the word line WL does not become indefinite.

Incidentally, a case where the potential of the word line WL has become indefinite hypothetically will be described. When the voltage SVDD is powered on, the voltage SVDD is applied to any one of internal nodes in accordance with action of cross-coupling of the inverters of the memory cell 1.

On the other hand, the voltage VDD is set to the "L" level.

Here, when the potential of the word line WL becomes indefinite, there is the possibility that a through-current may flow between the source of the voltage SVDD which has been applied to the internal node of the memory cell 1 and the back gate of the P channel MOS transistor of the pre-charge circuit 3 to which the source of the voltage VDD (the "L" level) used for the electrically coupled peripheral circuit or the back gate of the P channel MOS transistor of the selection circuit 4 via the access transistor.

Therefore, as in the configuration according to the embodiment, it is possible to suppress flowing of the through-current between the voltage SVDD source and the voltage VDD source and to avoid generation of defects such as a malfunction, a failure and so forth by fixing the word line WL to the "L" level.

Then, the power source shutdown control circuit 40 sets the control signal PWSSP to the "L" level in accordance with rising of the voltage VDD. Thereby, the P channel MOS transistors 31 and 32 of the switch 30 conduct and the power source line VL and the power source line SVL are brought into the short-circuited state.

In addition, the control signal LCM and the word line fixing signal LCMWD are set to the "L" level. In addition, the address decoder 21 is initialized and the pre-decode signals XU and XL are set to the "L" level.

On the other hand, also when the voltage VDD has been powered on earlier than the voltage SVDD, the address decoder 21 is initialized and the pre-decode signals XU and XL are set to the "L" level.

Thereby, the N channel MOS transistor NT of the driver unit 22 conducts and the word line WL is electrically coupled with the ground voltage VSS source. Accordingly, since the word line WL is set to the "L" level, it does not become indefinite and no through-current flows between the voltage VDD source and the voltage SVDD source.

Owing to the configuration according to the embodiment, it becomes possible to drive the circuit concerned with no generation of defects regardless of the order of powering on the power sources of the voltage VDD and the voltage SVDD and it becomes possible for circuit designers and others to implement a circuit configuration which is easily designed.

Figure 4:
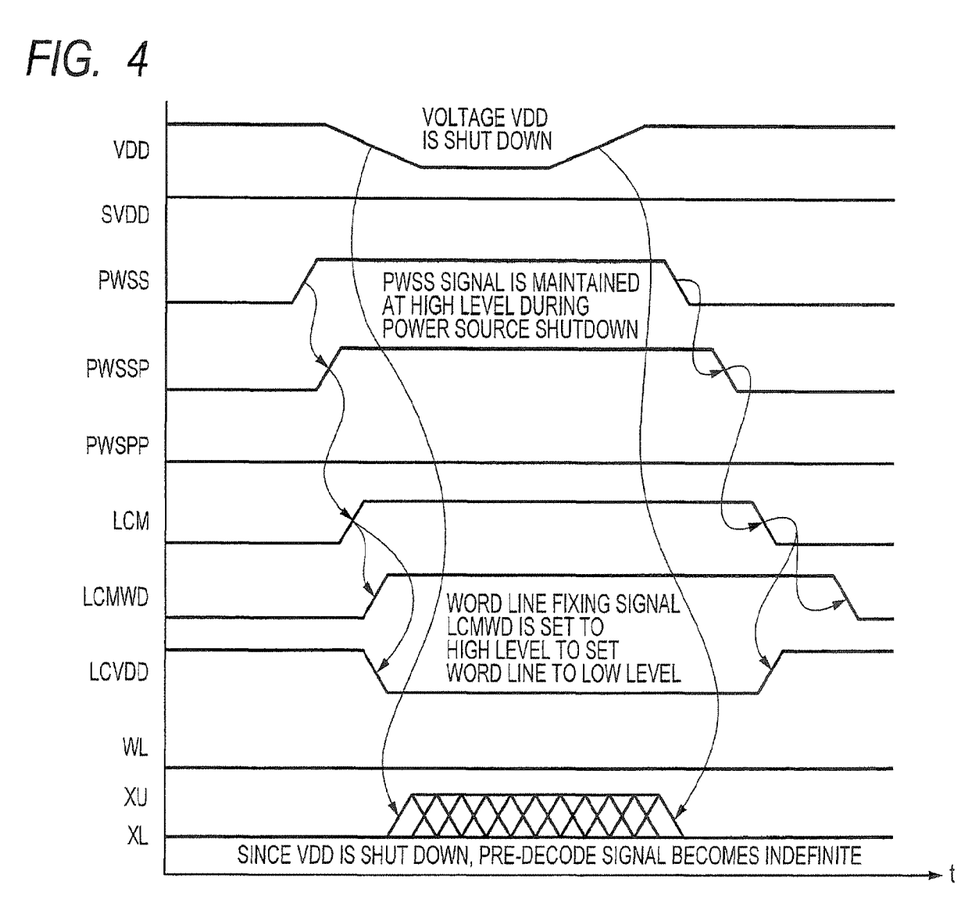
FIG. 4 is an explanatory diagram illustrating one example of potential levels in power-shutdown in the standby mode.

FIG. 4 is an explanatory diagram illustrating one example of potential levels in power-shutdown in the standby mode.

As illustrated in FIG. 4, an operation when the voltage VDD has been shut down will be described.

First, a case where both of the voltage VDD and the voltage SVDD are being powered on is illustrated.

Next, a case where the voltage VDD from the VDD power source regulator 60 is shut down and the potential thereof shifts to the "L" level is illustrated.

In addition, a state where the control command PWSS has risen up to the "H" level is illustrated.

Thereby, the power source shutdown control circuit 40 sets the control signal PWSSP to the "H" level. On the other hand, since the voltage SVDD maintains the "H" level state, the control signal PWSPP maintains the "L" level state.

Accordingly, in this case, the P channel MOS transistor 31 of the switch 30 becomes nonconductive and the short-circuit between the power source line VL and the power source line SVL is decoupled.

Then, the control circuit 13 sets the control signal LCM to the "H" level in accordance with the control signal PWSSP. Thereby, the N channel MOS transistor 14B of the power source line drive circuit 14 conducts and electrically couples the word power source line LCVDD with the ground voltage VSS source.

In addition, the NAND circuit 25D of the control circuit 13 sets the word line fixing signal LCMWD to the "H" level in accordance with input of the signal (the "L" level) according to the potential of the control command PWSS.

The fixing transistor 12 conducts in accordance with the word line fixing signal LCMWD (the "H" level) and electrically couples the word line WL with the ground voltage VSS source. The word line WL is set to the "L" level.

Thereby, since the word line WL is set to the "L" level, the access transistor of the memory cell 1 is brought into the nonconductive state. Accordingly, the potential of the word line WL does not become indefinite.

Next, a case where the voltage VDD is supplied from the VDD power source regulator 60 and the potential thereof has shifted to the "H" level is illustrated.

In addition, a state where the control command PWSS has fallen to the "L" level is illustrated.

Thereby, the power source shutdown control circuit 40 sets the control signal PWSSP to the "L" level. On the other hand, since the voltage SVDD maintains the "H" level state, the control signal PWSPP maintains the "L" level state.

Accordingly, in this case, the P channel MOS transistors 31 and 32 of the switch 30 conduct and the power source line VL and the power source line SVL are short-circuited.

In addition, the control signal LCM and the word line fixing signal LCMWD are set to the "L" level. In addition, the address decoder 21 is initialized and the pre-decode signals XU and XL are set to the "L" level.

<Configuration of Switch>

Figure 5:
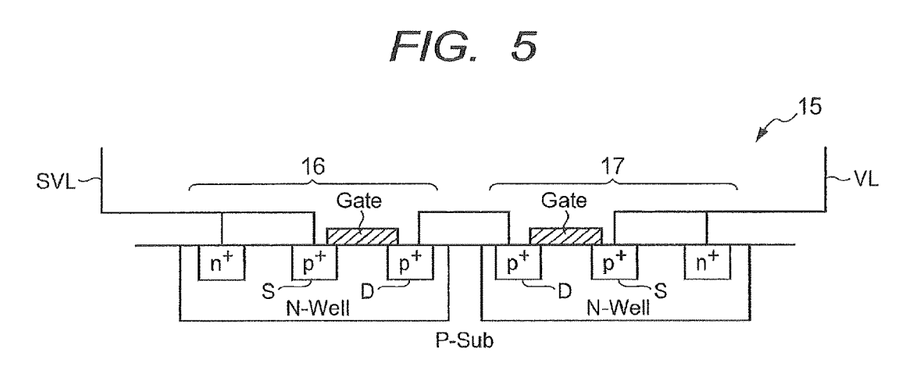
FIG. 5 is an explanatory sectional diagram schematically illustrating one example of a configuration of a switch 15 according to the embodiment.

FIG. 5 is a sectional diagram schematically illustrating one example of a configuration of the switch 15 according to the embodiment.

Referring to FIG. 5, the P channel MOS transistors 16 and 17 are formed in the N type wells N-Well provided in a P type semiconductor substrate P-Sub. A source S of the P channel MOS transistor 16 is coupled to the power source line SVL and a drain D thereof is coupled to a drain D of the P channel MOS transistor 17. The N type well N-Well that the P channel MOS transistor 16 is formed is coupled to the power source line SVL.

A source S of the P channel MOS transistor 17 is coupled to the power source line VL and the drain D thereof is coupled to the drain D of the P channel MOS transistor 16. The N type well N-Well that the P channel MOS transistor 17 is formed is coupled to the power source line VL.

When the semiconductor device 100 is powered on, the SVDD power source regulator 80 and the VDD power source regulator 60 are respectively started and thereby the voltage SVD and the voltage VDD respectively rise. The P channel MOS transistor 16 receives the voltage SVDD in the source S and the N type well N-Well. The P channel MOS transistor 17 receives the voltage VDD in the source S and the N type well N-Well.

Here, a case where rising of the voltage SVDD is slower than rising of the voltage VDD is supposed. In this case, in the P channel MOS transistor 17, even when the voltage VDD is at the "H" level, the P channel MOS transistor 17 is not turned on until the voltage SVDD rises up to the "H" level. Therefore, the drain D of the P channel MOS transistor 17 is brought into a high impedance state.

On the other hand, in the P channel MOS transistor 16, even when the voltage VDD is at the "H" level, the control signal PWSPP is not set to the "L" level until the voltage SVDD rises up to the "H" level. Therefore, the P channel MOS transistor 16 is not turned on. Since the drain D of the P channel MOS transistor 16 is still in the high impedance state even in such a state, a PN junction between the drain D and the corresponding N type well N-Well is not biased in a forward direction. Therefore, no current flows through the PN junction.

Incidentally, also when rising of the voltage SVDD is slower than rising of the voltage VDD, the same may be said. In this case, in the P channel MOS transistor 17, since a PN junction between the drain D and the corresponding N type well N-Well is not biased in the forward direction, no current flows through the PN junction.

The PN junction of each of the P channel MOS transistors 16 and 17 is not biased in the forward direction regardless of which one of the voltage SVDD and the voltage VDD rises up to the "H" level first as described above. Accordingly, since the restriction on the power source start-up sequence becomes unnecessary, it becomes possible to drive the circuit with no generation of defects regardless of the power-on sequence.

Incidentally, although in the example in FIG. 5, description has been made by using the configuration of the switch 15, the same applies to the configuration of the switch 30.

Figure 6:
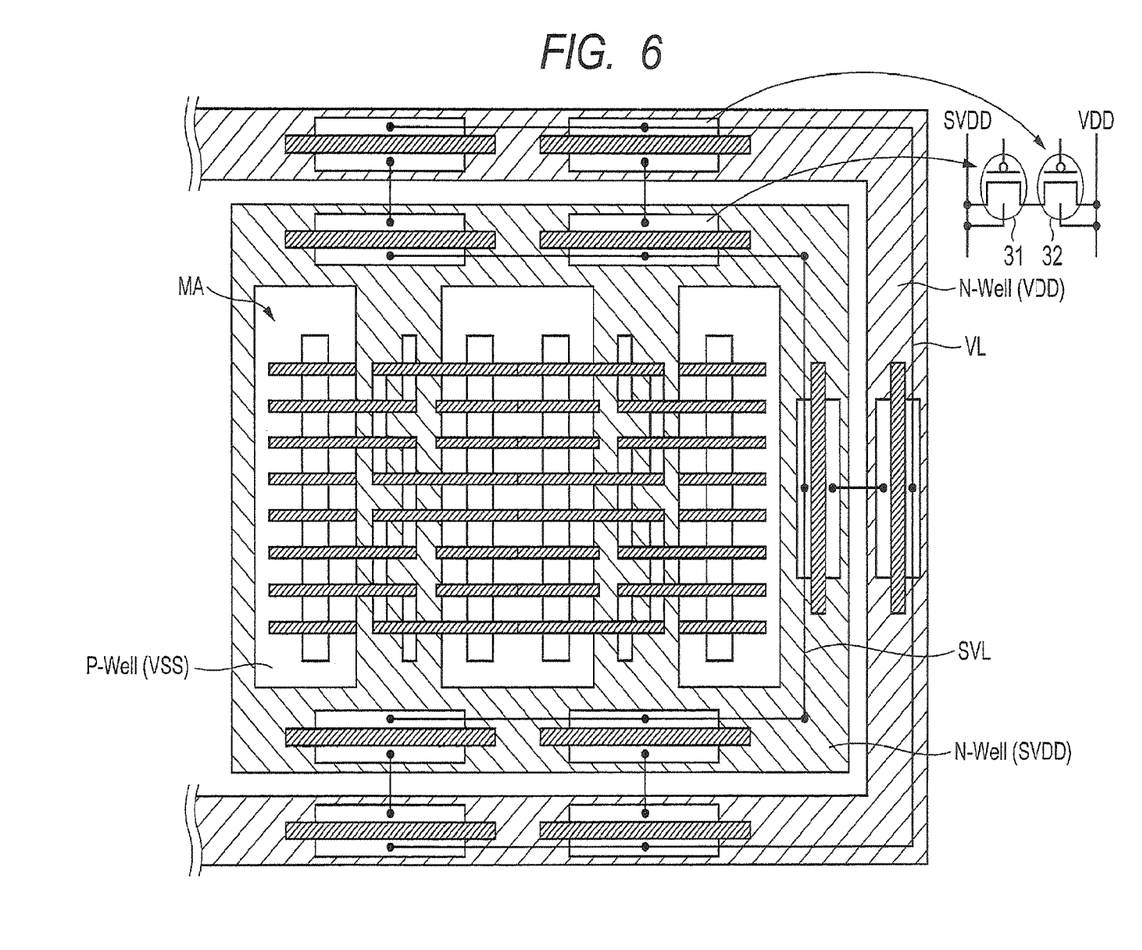
FIG. 6 is an explanatory diagram illustrating one example of a layout configuration of a switch 30 according to the embodiment.

FIG. 6 is an explanatory diagram illustrating one example of a layout configuration of the switch 30 according to the embodiment.

As illustrated in FIG. 6, in this example, a configuration that the switches have been provided around a memory cell region of the memory array MA is illustrated by way of example.

Specifically, the N type well N-Well is provided in a peripheral region of a P type well P-Well to which the voltage VSS is to be supplied and the voltage SVDD is to be supplied to the N type well N-Well concerned.

In the N type well N-Well to which the voltage SVDD is to be supplied, the P channel MOS transistor which configures the memory cell 1 and the P channel MOS transistor which configures the driver unit 22 are provided.

In addition, the P channel MOS transistor 31 is formed in the N type well N-Well. A source of the P channel MOS transistor 31 is coupled with the power source line SVL. A drain of the P channel MOS transistor 31 is coupled with a drain of the P channel MOS transistor 32.

The P channel MOS transistor 32 is provided in an outer side N type well N-Well. The voltage VDD is to be supplied to that outer side N type well N-Well. The outer side N type well N-Well to which the voltage VDD is to be supplied is shared with the peripheral circuit 20 and the P channel MOS transistor which configures the peripheral circuit 20 is provided in the outer side N type well N-Well.

A source of the P channel MOS transistor 32 is coupled with the power source line VL.

In the example in FIG. 6, a configuration that the plurality of switches 30 have been provided around the memory cell region of the memory array MA is illustrated.

Both of the P channel MOS transistors 31 and 32 of the switch 30 concerned conduct, thereby the power source lines are short-circuited and the common voltage is supplied to the wells.

In the example in FIG. 6, the configuration that the P channel MOS transistor 31 has been provided in the memory cell region is illustrated. That is, the configuration that since the memory cell region is formed in the N type well N-Well to which the voltage SVDD is to be supplied, the P channel MOS transistor 31 has been provided in the N type well N-Well to which the same voltage SVDD is to be supplied and the P channel MOS transistor 32 has been provided in the outer side N type well N-Well to which the voltage VDD is to be supplied is illustrated.

Owing to the above-mentioned configuration, it is possible to promote efficiency of the layout area by providing the P channel MOS transistor 31 in the memory cell region.

If it is intended to provide the P channel MOS transistor 31 in a region located on the outer side of the memory cell region, it will be necessary to provide the N type well N-Well that the P channel MOS transistor 31 is to be formed and to which the voltage SVDD is to be supplied separately from the N type well N-Well to which the voltage VDD is to be supplied. In general, it is necessary to leave a wider space for separation between the N type wells N-Well which are different from each other in potential level and the layout area of the switches 30 is increased to that extent.

In the example in FIG. 6, since the N type well N-Well which is formed separately from the outer side N type well N-Well which is formed on the periphery of the memory cell region and to which the voltage VDD is to be supplied and to which the voltage SVDD is to be supplied is utilized, it is possible to reduce the area of the switches as mentioned above.

Figure 7:
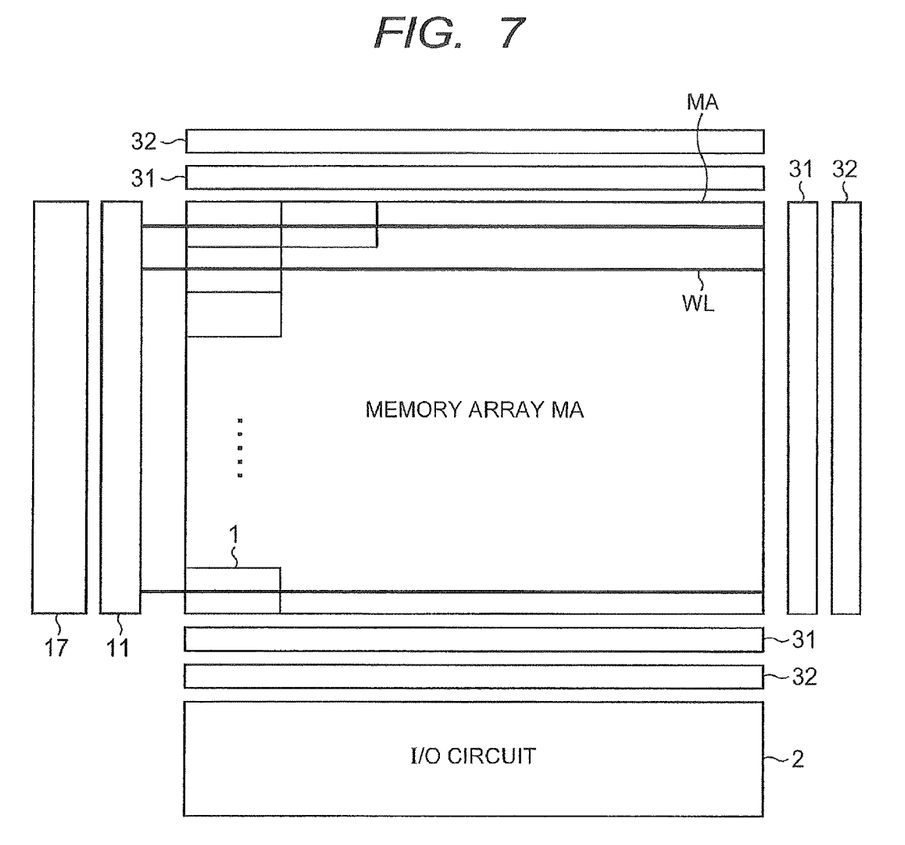
FIG. 7 is an explanatory diagram illustrating one example of a general layout of the semiconductor device 100 according to the embodiment.

FIG. 7 is an explanatory diagram illustrating one example of a general layout of the semiconductor device 100 according to the embodiment.

As illustrated in FIG. 7, the plurality of switches 30 are arranged around the memory array MA. Then, in this circumstance, the P channel MOS transistors 31 and the P channel MOS transistors 32 which configure the switches 30 in pairs are provided so as to surround the outer periphery (upper, lower and right sides) of the memory array MA.

The P channel MOS transistors 31 are provided in the memory cell region and mutually share the N type well N-Well to which the voltage SVDD is to be supplied. In addition, the P channel MOS transistors 32 are provided in the outer side N type well N-Well to which the voltage VDD is to be supplied and therefore are formed on the outer side of the memory cell region. The I/O circuit 2 shares the outer side N type well N-Well to which the voltage VDD is to be supplied with the P channel MOS transistors 32.

Incidentally, since the driver and decoder 17 and the word line fixing circuit 11 share the power source with the memory array MA, the switch 30 is not arranged on an outer peripheral part (the left side) of the memory array MA on which the driver and decoder 17 and the word line fixing circuit 11 are provided.

In addition, in the example in FIG. 7, the power source line VL and the power source line SVL are short-circuited on the side closer to the memory cell region by configuring so as to provide the plurality of switches 30 between the power source line VL and the power source line SVL. Thereby, it is possible to supply the voltages of the same voltage level by suppressing generation of a potential difference caused by power source wiring.

Thereby, it is possible to suppress generation of the malfunction and the leakage current.

<Altered Example>

Figure 8:
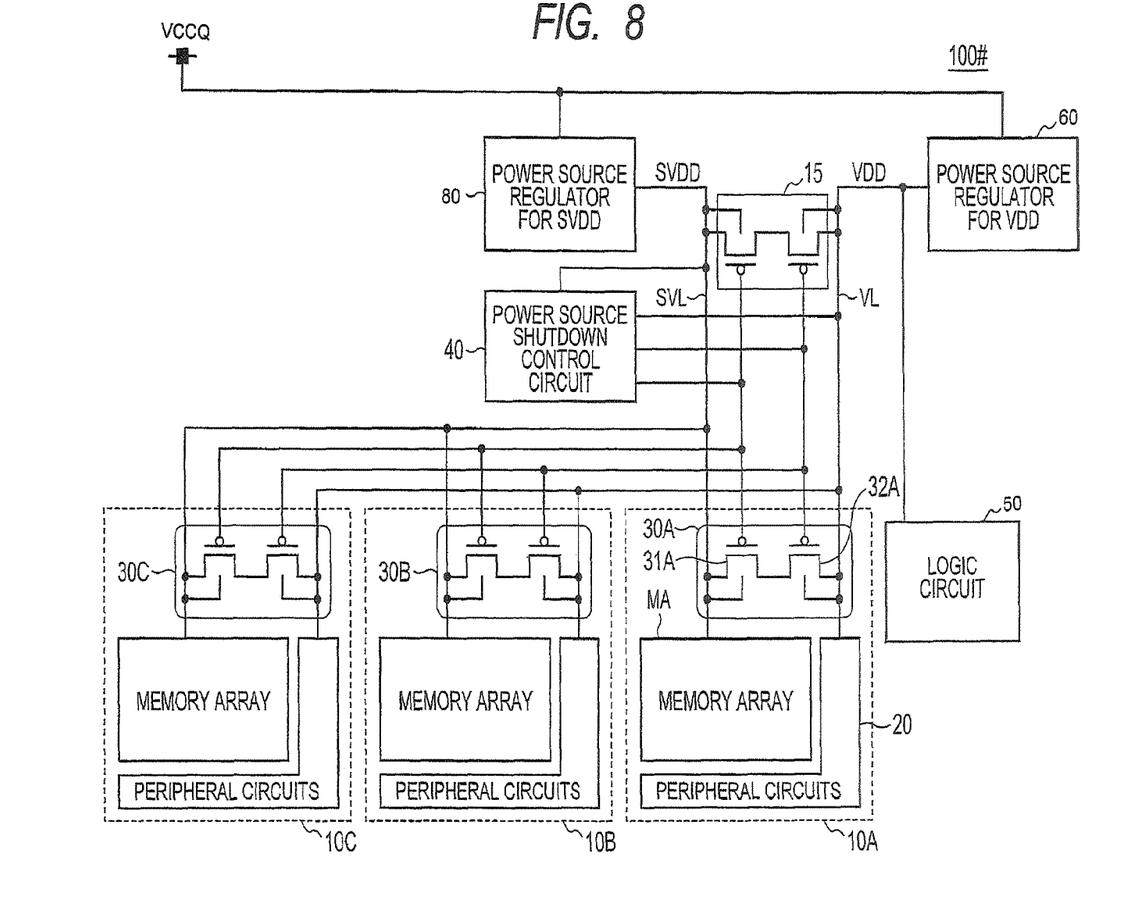
FIG. 8 is a diagram illustrating one example of a general configuration of a semiconductor device 100# according to an altered example of the embodiment.

FIG. 8 is a diagram illustrating one example of a general configuration of a semiconductor device 100# according to an altered example of the present embodiment.

Referring to FIG. 8, the semiconductor device 100# is different from the semiconductor device 100 in that a plurality of memory circuits have been additionally provided. Specifically, the semiconductor device 100# has a configuration that memory circuits 10A to 10C have been provided and the memory circuits 10A to 10C. The memory circuits 10A to 10C are configured so as to mutually share the power source lines VL and SVL.

The memory circuits 10A to 10C respectively include switches 30A to 30C.

The switches 30A to 30C have the same function as the switch 30.

Accordingly, in the configuration that the plurality of memory circuits 10A to 10C are provided, loads caused by, in particular, the wiring resistance are made different from one another and a potential difference is liable to generate. However, by a configuration that the switch for short-circuiting the power source line VL and the power source line SVL is provided in each memory circuit, the power source lines VL and the SVL are short-circuited on the side closer to the memory cell region and thereby it is possible to supply the voltages of the same voltage level by suppressing generation of a potential difference caused by the power source wiring.

Although, in the foregoing, the present disclosure has been specifically described on the basis of the embodiment, it goes without saying that the present disclosure is not limited to the embodiment and it is possible to alter and modify the present disclosure in a variety of ways within a scope not deviating from the gist of the present disclosure.

What is claimed is:

1. A semiconductor device including a first mode and a second mode different from the first mode, comprising:
    a memory circuit comprised of a first switch, a memory array, and a peripheral circuit;
    a first power source line electrically coupled with an I/O circuit of the peripheral circuit, and supplied with a first voltage in the first mode; and
    a second power source line electrically coupled with a memory cell of the memory array, and supplied with a second voltage lower than the first voltage in the second mode,
    wherein the first switch is comprised of a first field effect transistor and a second field effect transistor,
    wherein a source of the first field effect transistor is electrically coupled with the first power source line,
    wherein a source of the second field effect transistor is electrically coupled with the second power source line,
    wherein the first field effect transistor is formed on a first well located in a region where the memory cell is formed, and
    wherein the second field effect transistor is formed on a second well located in a region where the I/O circuit is formed.

2. The semiconductor device according to claim 1, wherein, in plan view, the first field effect transistor and the second field effect transistor are located between the memory array and the I/O circuit.

3. The semiconductor device according to claim 2, wherein, in plan view, the first field effect transistor is located between the second field effect transistor and the I/O circuit.

4. The semiconductor device according to claim 1,
    wherein a second switch is formed outside the region where the memory circuit is formed, and
    wherein the second switch includes a third field effect transistor having a source electrically coupled with the first power source line, and a fourth field effect transistor having a source electrically coupled with the second power source line.

5. The semiconductor device according to claim 1, wherein the first mode is an active mode, and wherein the second mode is an active mode and a standby mode.

6. The semiconductor device according to claim 1, wherein each of the first field effect transistor and the second field effect transistor is a p-type field effect transistor.

7. The semiconductor device according to claim 6, wherein each of the first well and the second well is an n-type impurity region.

8. The semiconductor device according to claim 1, wherein a drain of the first field effect transistor and a drain of the second field effect transistor are electrically connected to each other.

* * * * *